United States Patent
Boerstler et al.

(10) Patent No.: US 7,061,223 B2
(45) Date of Patent: Jun. 13, 2006

(54) PLL MANUFACTURING TEST APPARATUS

(75) Inventors: David William Boerstler, Round Rock, TX (US); Kazuhiko Miki, Round Rock, TX (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/606,580

(22) Filed: Jun. 26, 2003

(65) Prior Publication Data

US 2004/0263146 A1    Dec. 30, 2004

(51) Int. Cl.
G01R 23/12    (2006.01)
H03L 7/06     (2006.01)
H03B 5/12     (2006.01)

(52) U.S. Cl. ............... 324/76.53; 327/157; 331/177 R (58) Field of Classification Search ............. 324/76.53, 324/523, 527; 327/156–159, 147–150; 331/DIG. 2, 331/177 R See application file for complete search history.

(56) References Cited

U.S. PATENT DOCUMENTS

| 4,851,712 | A  | * | 7/1989  | Imai et al. ................. 327/534 |
| 5,987,085 | A  | * | 11/1999 | Anderson ................... 375/374 |
| 6,294,935 | B1 | * | 9/2001  | Ott ........................... 327/150 |
| 6,442,271 | B1 | * | 8/2002  | Tuttle et al. ........... 379/399.01 |
| 6,492,798 | B1 | * | 12/2002 | Sunter ..................... 324/76.15 |
| 6,512,419 | B1 | * | 1/2003  | Adams et al. ................. 331/17 |
| 6,597,249 | B1 | * | 7/2003  | Chien et al. ............ 331/177 R |
| 6,657,917 | B1 | * | 12/2003 | Lever ......................... 365/233 |
| 2003/0071748 | A1 | * | 4/2003 | Huang et al. ................ 341/155 |

* cited by examiner

*Primary Examiner*—Anjan Deb
*Assistant Examiner*—Jeff Natalini
(74) *Attorney, Agent, or Firm*—Carr LLP; Diana R. Gerhardt (57) ABSTRACT

A method and an apparatus for testing a phase-locked loop (PLL) are provided. A fixed-level reference clock signal and a test feedback clock signal are applied to a phase-frequency detector (PFD) of the PLL to measure a minimum output frequency of a voltage-controlled oscillator (VCO) of the PLL. A test reference clock signal and a fixed-level feedback clock signal are applied to the PFD to measure a maximum output frequency of the VCO. The lock and capture range of the PLL is determined based on the maximum and minimum frequencies of the VCO.

22 Claims, 14 Drawing Sheets

FIG. 14

PLL MANUFACTURING TEST APPARATUS

BACKGROUND OF THE INVENTION

1. Field of the Invention

The invention relates generally to testing electrical circuits and, more particularly, to testing a phase-locked loop (PLL).

2. Description of the Related Art

Full characterization of a phase-locked loop (PLL) can involve both a large number of tests and lengthy time for each test due to the large time constants within the PLL circuit and the variability that process, temperature, and supply voltage have on PLL performance. Lock range and capture range tests are standard tests implemented at a manufacturing level, but these tests must be limited in number to keep test time reasonable and inexpensive, preventing full PLL characterization.

Therefore, a need exists for a system and method for fully characterizing a PLL with reduced number of tests.

SUMMARY OF THE INVENTION

The invention provides a method and an apparatus for testing a phase-locked loop (PLL). The PLL typically has a phase-frequency detector (PFD) and a voltage-controlled oscillator (VCO), which receives input from the PFD. A fixed-level reference clock signal and a test feedback clock signal are applied to the PFD to measure a minimum output frequency of the VCO. A test reference clock signal and a fixed-level feedback clock signal are applied to the PFD to measure a maximum output frequency of the VCO. The lock and capture range of the PLL is determined based on the maximum and minimum frequencies of the VCO.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

In the following discussion, numerous specific details are set forth to provide a thorough understanding of the present invention. However, it will be obvious to those skilled in the art that the present invention may be practiced without such specific details. In other instances, well-known elements have been illustrated in schematic or block diagram form in order not to obscure the present invention in unnecessary detail.

It is further noted that, unless indicated otherwise, all functions described herein may be performed in either hardware or software, or some combination thereof. In a preferred embodiment, however, the functions are performed by a processor such as a computer or an electronic data processor in accordance with code such as computer program code, software, and/or integrated circuits that are coded to perform such functions, unless indicated otherwise.

Figure 1:
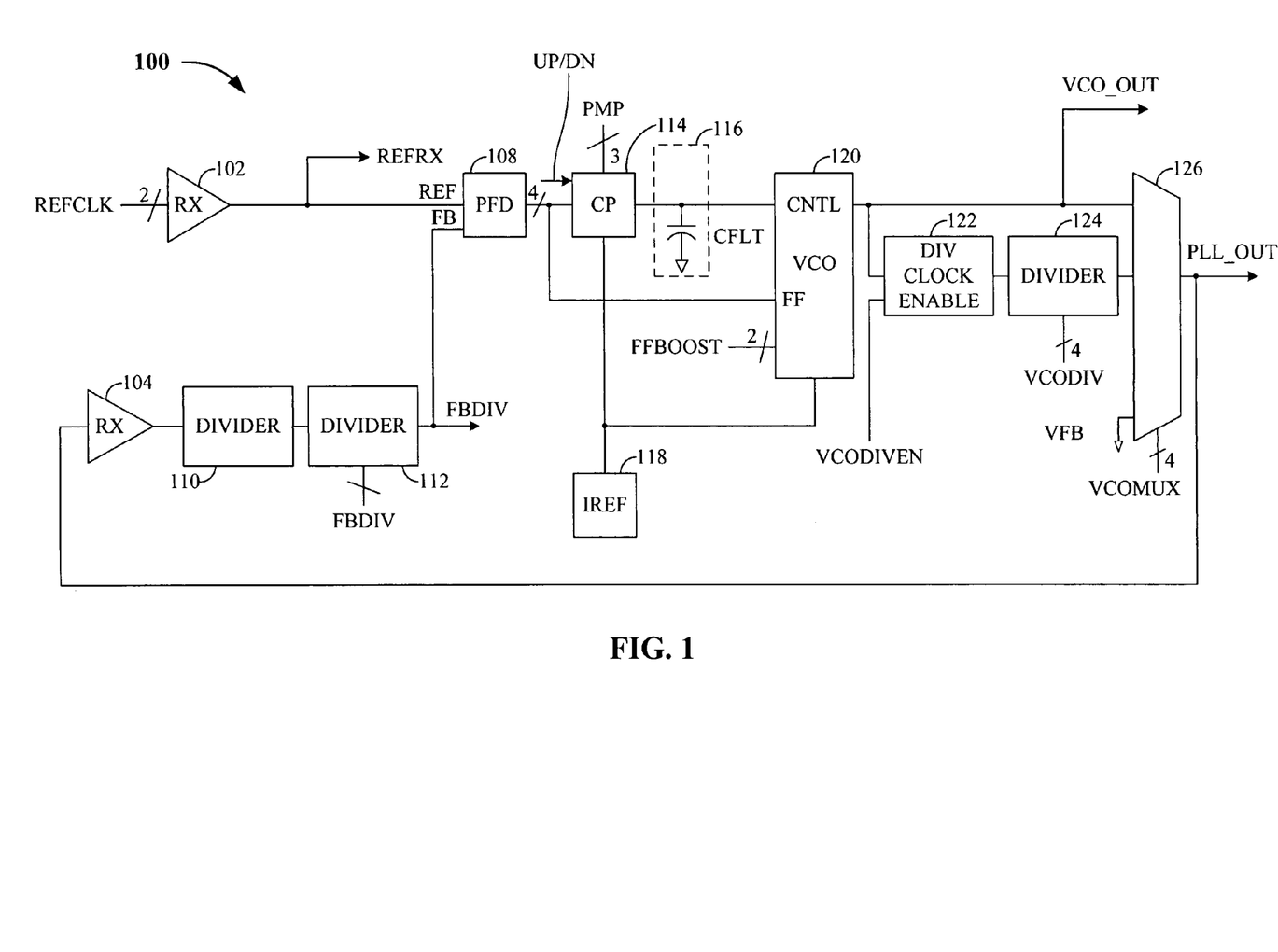
FIG. 1 is a block diagram illustrating a phase-locked loop (PLL) along with a test apparatus to characterize a voltage-controlled oscillator (VCO)

Referring to FIG. 1 of the drawings, the reference numeral 100 generally designates a phase-locked loop (PLL) along with a test apparatus to characterize a voltage-controlled oscillator (VCO). The PLL 100 comprises first and second delays RXs 102 and 104, a phase-frequency detector (PFD) 108, a first and second frequency dividers 110 and 112, a charge pump (CP) 114, a loop filter (LF) 116, a reference current generator IREF 118, a voltage-controlled oscillator (VCO) 120, a divider clock enable unit 122, a third frequency divider 124, and a first multiplexer 126.

The first delay RX 102 is coupled to the PFD 108. The PFD 108 is coupled to the CP 114 for providing UP and DN signals to the CP 114. The CP 114 is also coupled to the LF 116, which in this implementation includes a CFLT capacitance. The LF 116 is also coupled to the VCO 120 to provide an input voltage CNTL to the VCO 120. Optionally, the output of the PFD 108 is also coupled to a feedforward input FF of the VCO 120. The reference current generator IREF 118 is also coupled to both the CP 114 and the VCO 120. The PFD 108 is also coupled to the second frequency divider 112, which is coupled to the first frequency divider 110. Specifically, the first frequency divider 110 is a pre-scaler, and the second frequency divider 112 is a programmable frequency divider. The first frequency divider 110 is also coupled to the second delay RX 104 to receive PLL_OUT signal.

The first multiplexer 126 is coupled to the VCO 120 both directly and through the divider clock enable unit 122 and the third frequency divider 124. The first multiplexer 126 also receives a fixed-level voltage VFB. A select signal VCOMUX selects one of these three inputs as a PLL clock signal PLL_OUT. The PLL_OUT feeds back to the second delay RX 104.

The PLL_OUT goes through the second delay RX 104 and thus is matched in delay to the REFCLK. The delay PLL_OUT is subsequently divided in frequency by the first and second feedback dividers 110 and 112 to create the signal FB and is compared with an external reference clock REF using the PFD 108. The UP and DN signals generated by the PFD enter the CP 114, which creates a current proportional to the PFD error. The current is integrated by the LF 116 to produce a voltage used to control the VCO 120. Optionally, the error signal is also injected directly into the feedforward FF port of the VCO, controlled by the FFBOOST pins. As mentioned above, the PLL_OUT can be selected from the VCO 120 directly, or it can be taken from the third frequency divider 124. The PLL_OUT can also be set to a DC low (or high) level by selecting the VFB, or even toggled between states as the select inputs to the mux are changed. The output of the VCO 120 (VCO_OUT) can be accessed directly, regardless of the signal PLL_OUT selected by the VCOMUX settings. Similarly, the input signal REFCLK can be switched between a regular reference clock signal and a DC low (or high) level. For example, a switch (not shown) may be coupled to the first delay RX 102 to select between the regular reference clock signal and the DC low (or high) level.

Figure 2:
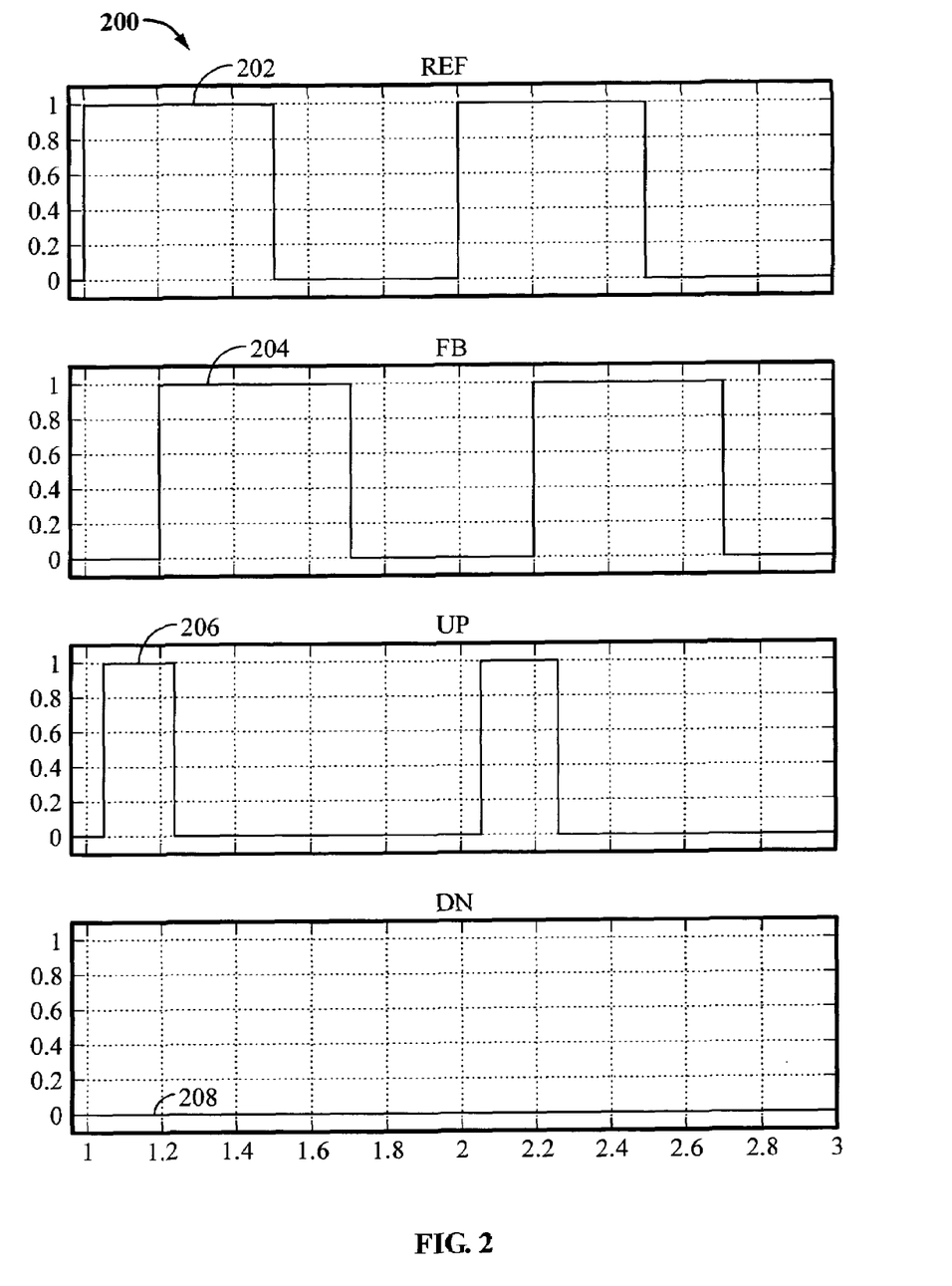
FIG. 2 is a timing diagram illustrating a phase-frequency detector (PFD) response to a reference clock signal REF leading a feedback clock signal FB under a normal operating mode of the PLL shown in FIG. 1.

Now referring to FIG. 2, a timing diagram 200 illustrates a phase-frequency detector (PFD) response to a reference clock signal REF leading a feedback clock signal FB under a normal operating mode of the PLL 100 shown in FIG. 1. The timing diagram 200 shows four signals REF 202, FB 204, UP 206, and DN 208. The REF 202 leads the FB 204. The UP 206 and DN 208 are PFD output signals in response to the REF 202 and the FB 204.

Figure 3:
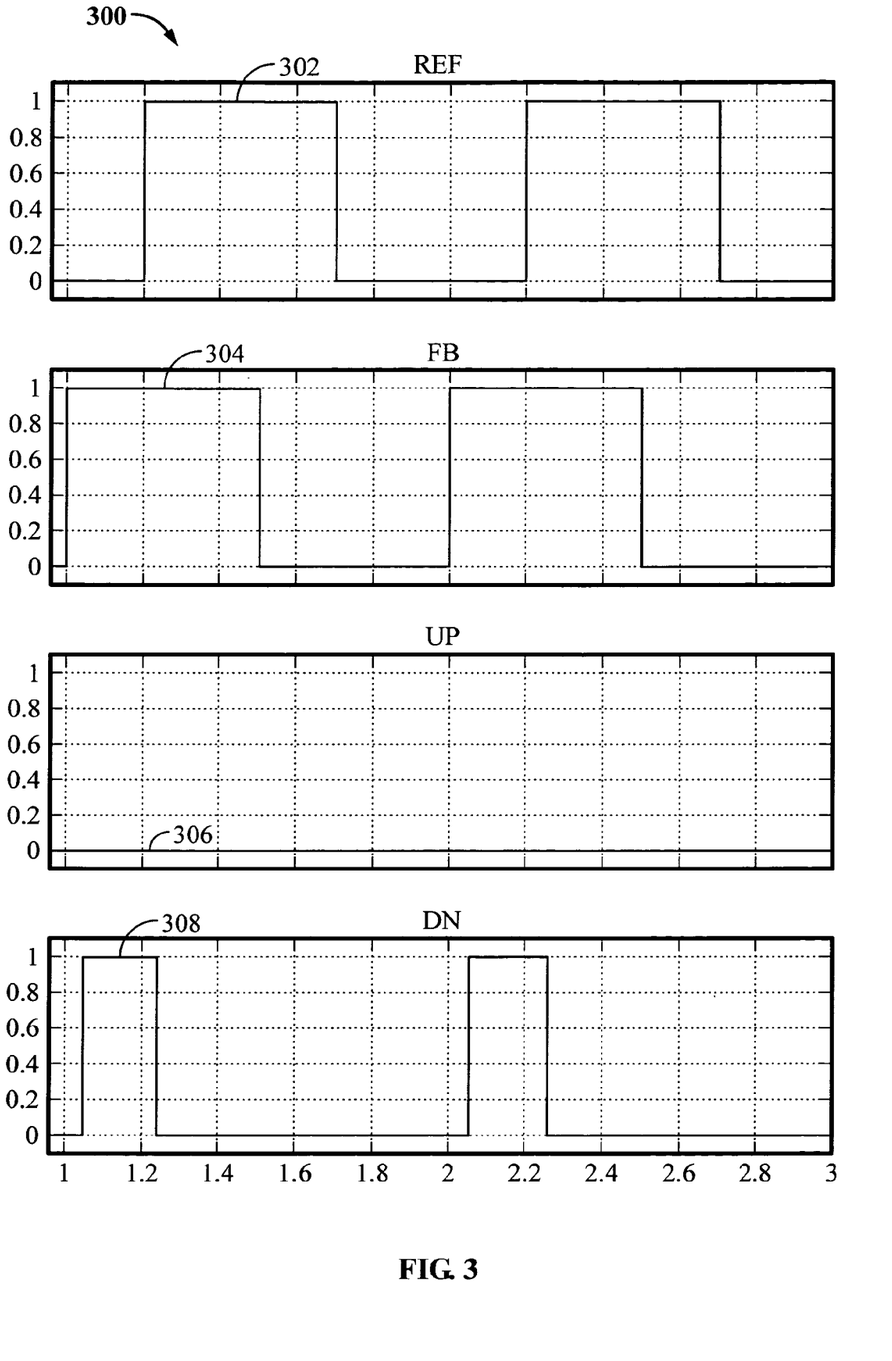
FIG. 3 is a timing diagram illustrating a PFD response to a feedback clock signal FB leading a reference clock signal REF under a normal operating mode of the PLL shown in FIG. 1.

In FIG. 3, a timing diagram 300 illustrates a PFD response to a feedback clock signal FB leading a reference clock signal REF under a normal operating mode of the PLL 100 shown in FIG. 1. The timing diagram 300 shows four signals REF 302, FB 304, UP 306, and DN 308. The FB 304 leads the REF 302. The UP 306 and DN 308 are PFD output signals in response to the REF 302 and the FB 304.

Figure 4:
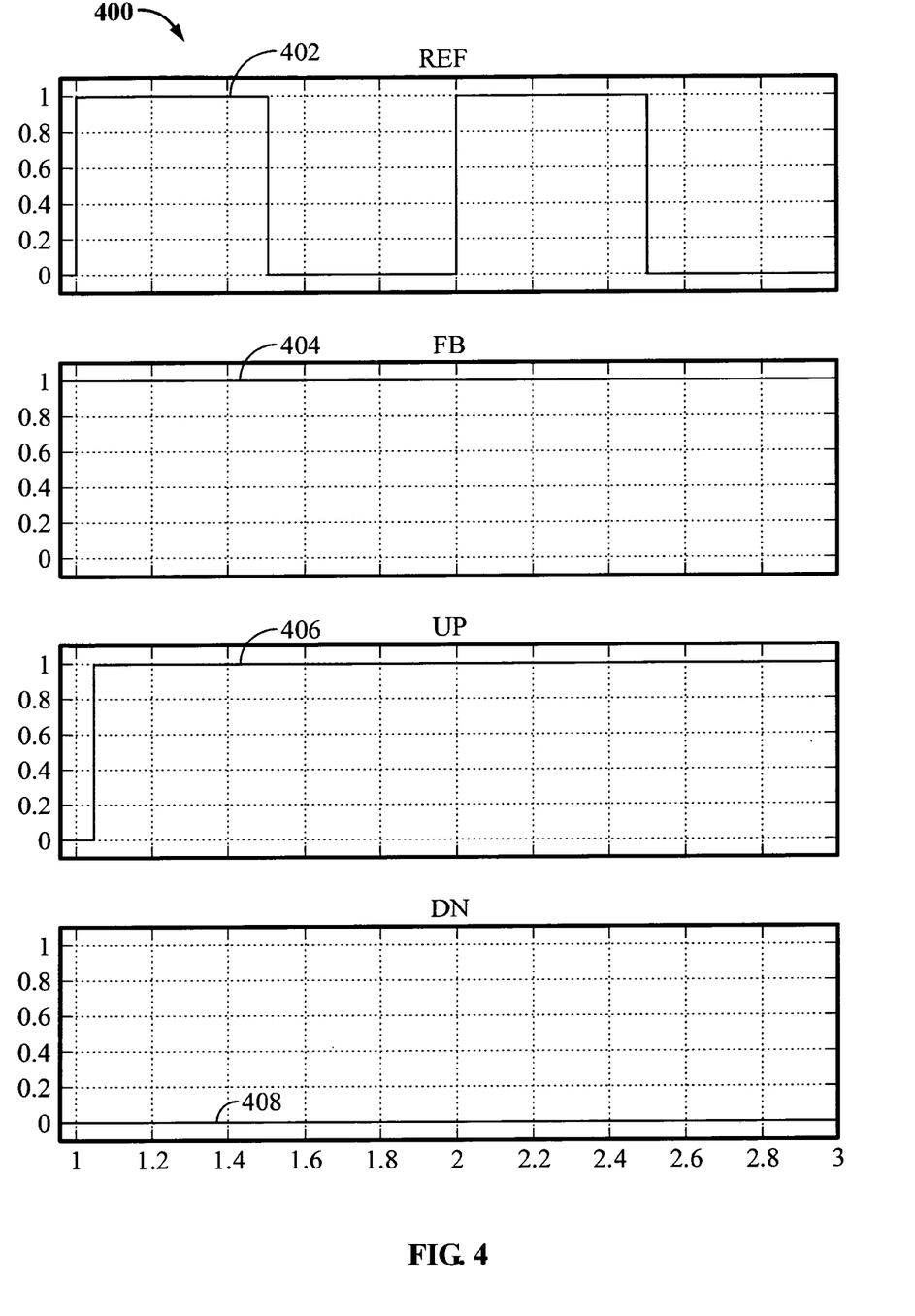
FIG. 4 is a timing diagram illustrating a PFD response to a high fixed-level feedback clock signal FB.

In FIG. 4, a timing diagram 400 illustrates a PFD response to a high fixed-level feedback clock signal FB. The timing diagram 400 shows four signals REF 402, FB 404, UP 406, and DN 408. The UP 406 and DN 408 are PFD output signals in response to the REF 402 and the FB 404. Note that the high fixed-level FB 404 results in the assertion of the UP 406.

Figure 5:
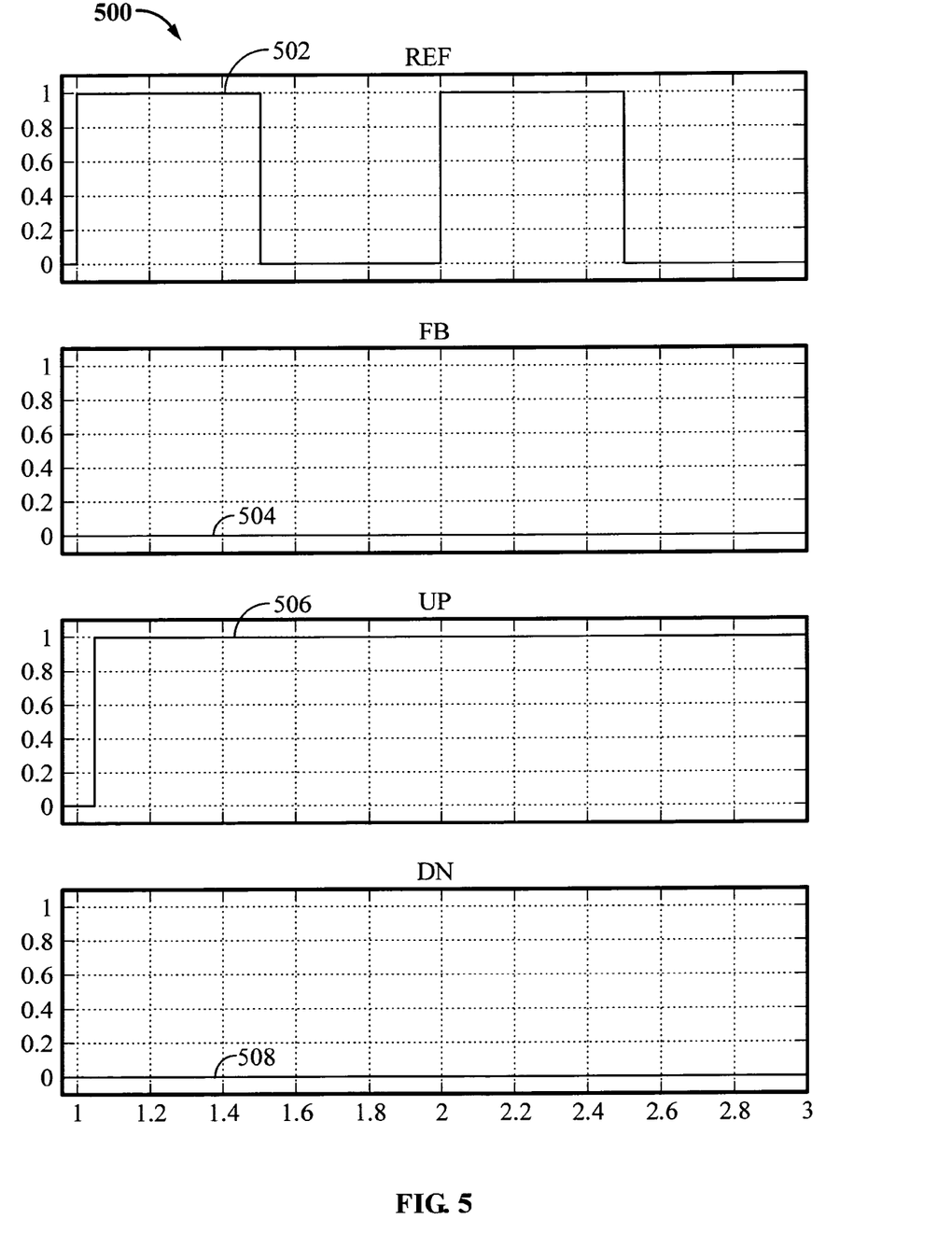
FIG. 5 is a timing diagram illustrating a PFD response to a low fixed-level feedback clock signal FB.

In FIG. 5, a timing diagram 500 illustrates a PFD response to a low fixed-level feedback clock signal FB. The timing diagram 500 shows four signals REF 502, FB 504, UP 506, and DN 508. The UP 506 and DN 508 are PFD output signals in response to the REF 502 and the FB 504. Note that the low fixed-level FB 504 results in the assertion of the UP 506.

In FIGS. 4 and 5, therefore, note that a fixed-level FB (high or low) results in the assertion of the UP output of the PFD 108.

Figure 6:
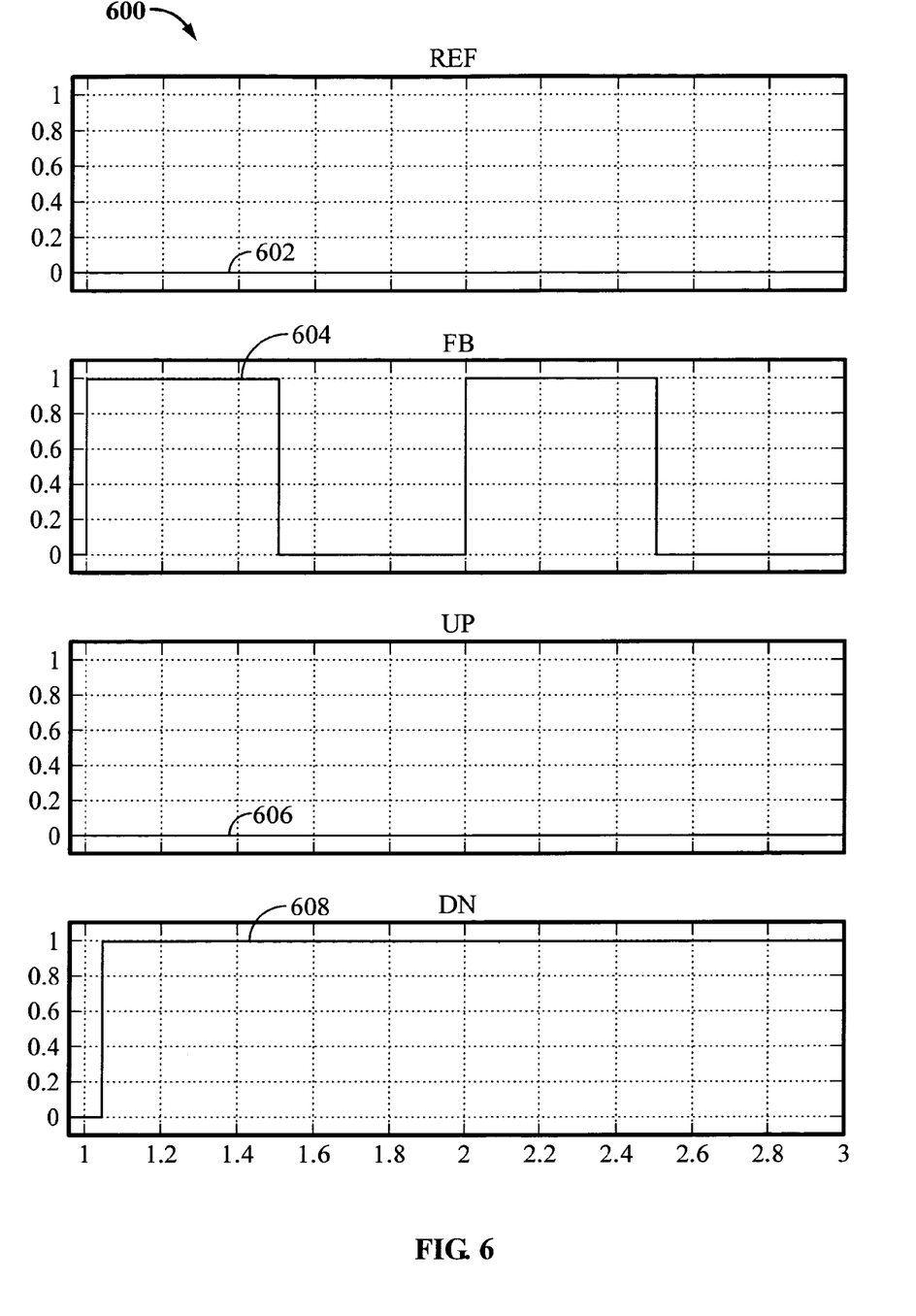
FIG. 6 is a timing diagram illustrating a PFD response to a low fixed-level reference clock signal REF.

In FIG. 6, a timing diagram 600 illustrates a PFD response to a low fixed-level reference clock signal REF. The timing diagram 600 shows four signals REF 602, FB 604, UP 606, and DN 608. The UP 606 and DN 608 are PFD output signals in response to the REF 602 and the FB 604. Note that the low fixed-level REF 602 results in the assertion of the DN 608.

Figure 7:
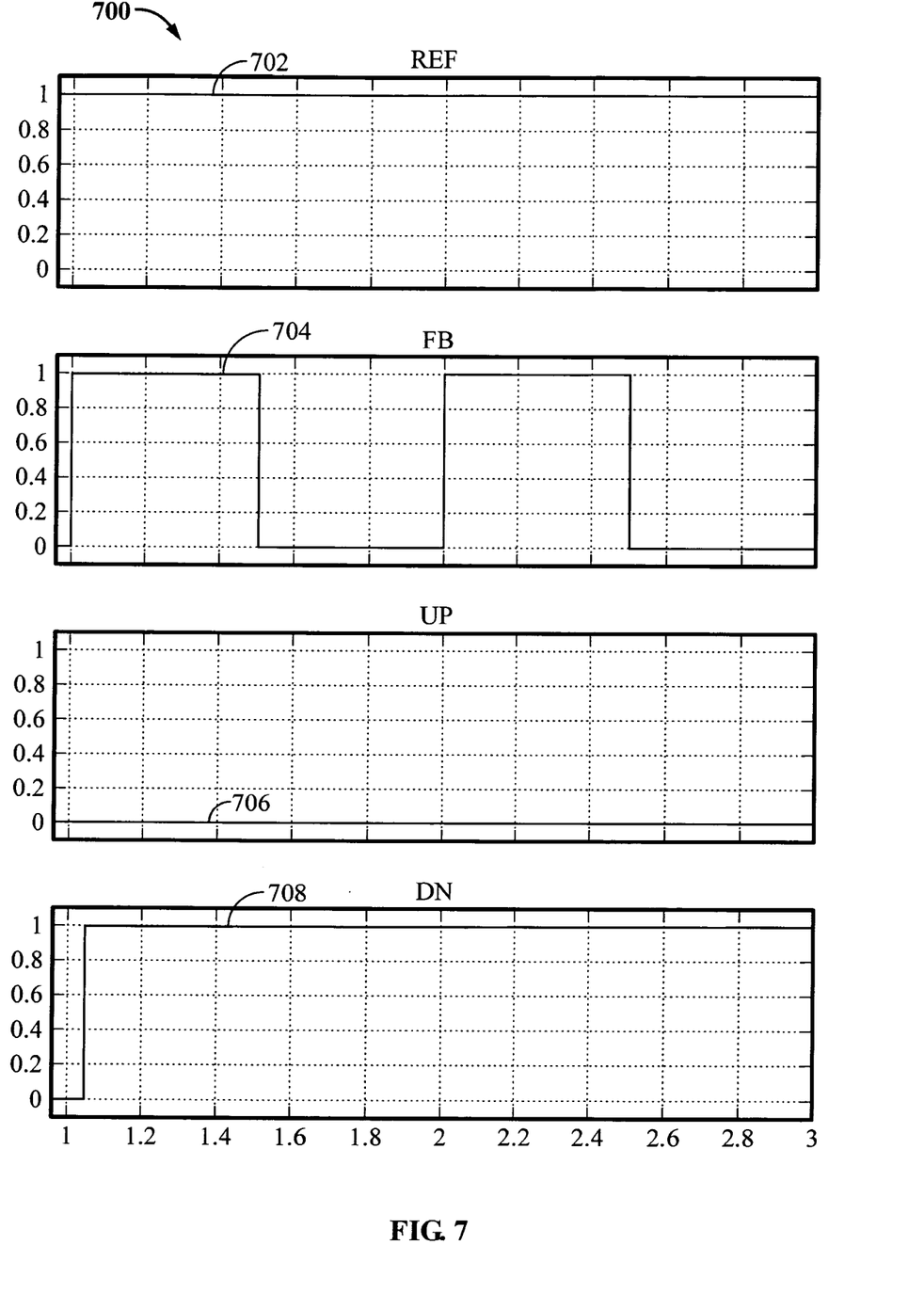
FIG. 7 is a timing diagram illustrating a PFD response to a high fixed-level reference clock signal REF.

In FIG. 7, a timing diagram 700 illustrates a PFD response to a high fixed-level reference clock signal REF. The timing diagram 700 shows four signals REF 702, FB 704, UP 706, and DN 708. The UP 706 and DN 708 are PFD output signals in response to the REF 702 and the FB 704. Note that the high fixed-level REF 702 results in the assertion of the DN 708.

In FIGS. 6 and 7, therefore, note that a fixed-level REF (high or low) results in the assertion of the DN output of the PFD 108.

Generally, the effect of UP being continuously asserted is that the VCO input will charge to supply voltage $V_{DD}$ and that the VCO frequency VCO_OUT will be at its maximum in a steady state. Similarly, the effect of DN being continuously asserted is that the VCO input will discharge to ground and that the VCO frequency will be at its minimum in a steady state.

Figure 8:
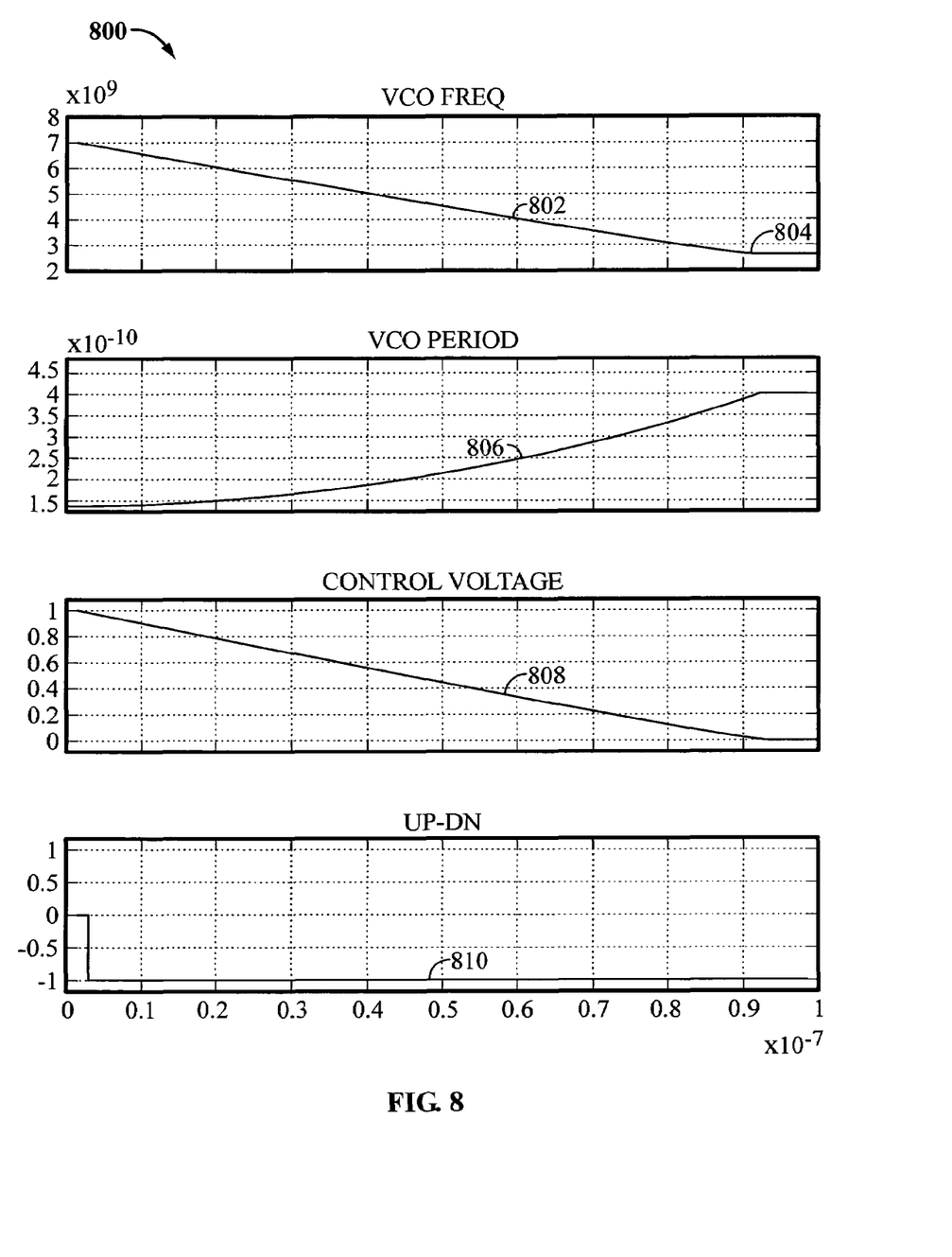
FIG. 8 is a timing diagram illustrating transient characteristics of a VCO output frequency VCO_OUT obtained under the bias conditions of FIGS. 6 and 7.
Figure 9:
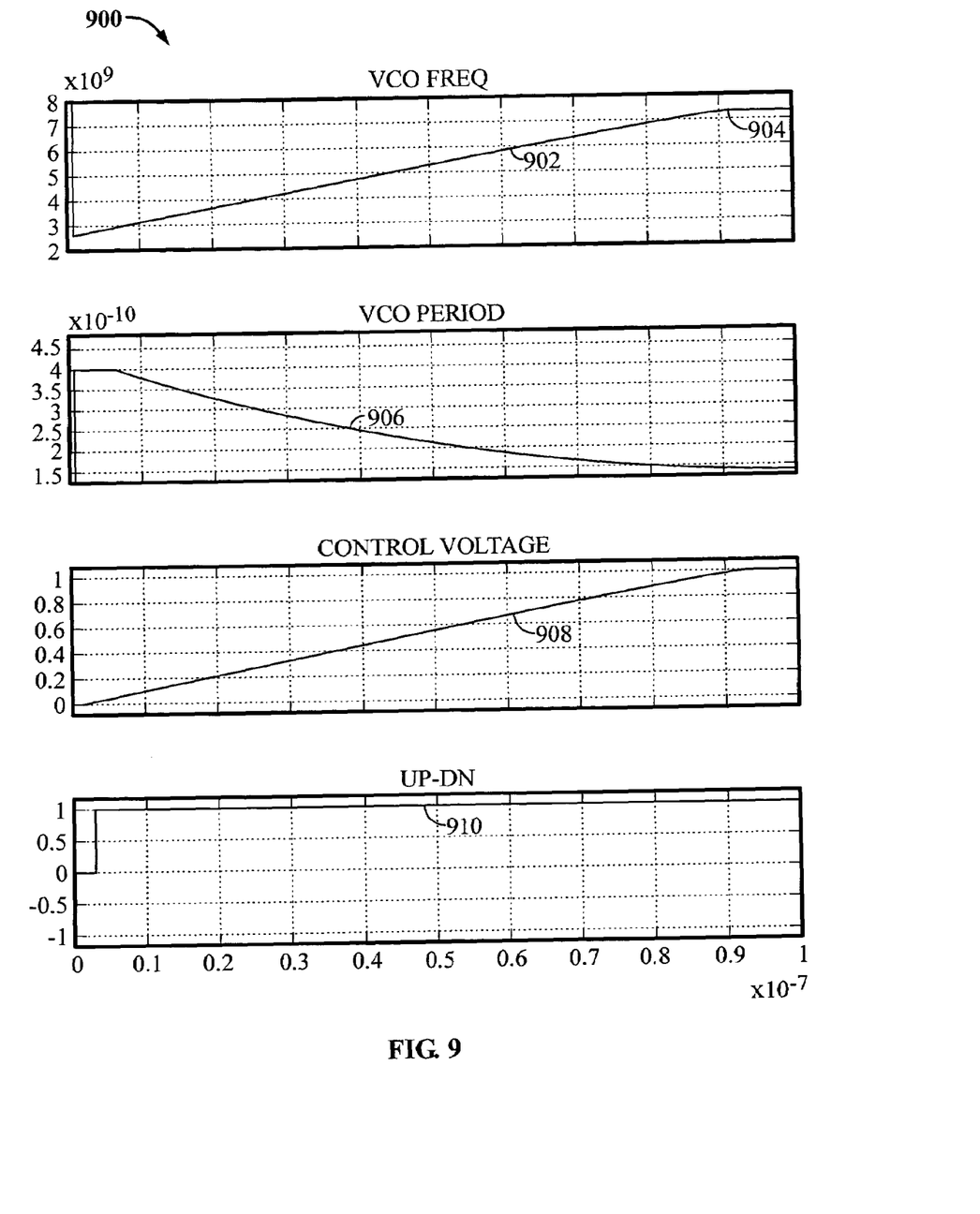
FIG. 9 is a timing diagram illustrating transient characteristics of a VCO output frequency VCO_OUT obtained under the bias conditions of FIGS. 4 and 5.

FIGS. 8 and 9 show the effect of VCO frequency VCO_OUT, VCO period, and control voltage, as the reference clock REF and feedback clock FB are fixed, respectively.

In FIG. 8, a timing diagram 800 illustrates a transient characteristic of a VCO output frequency VCO_OUT obtained under the bias conditions of FIGS. 6 and 7. The timing diagram 800 shows a VCO_OUT 802, a minimum VCO frequency 804, VCO period 806, control voltage 808, and UP-DN 810.

In FIG. 9, a timing diagram 900 illustrates a transient characteristic of a VCO output frequency VCO_OUT obtained under the bias conditions of FIGS. 4 and 5. The timing diagram 900 shows a VCO_OUT 902, a maximum VCO frequency 904, VCO period 906, control voltage 908, and UP-DN 910.

Once the VCO range is known (measured via the frequency dividers and the test clock outputs shown in FIG. 1), the expected values for lock and capture range may be estimated and a minimal set of tests can be performed on the PLL. Furthermore, since the VCO range is sensitive to process and environment, the VCO range can be used as a performance monitor for the process.

Figure 10:
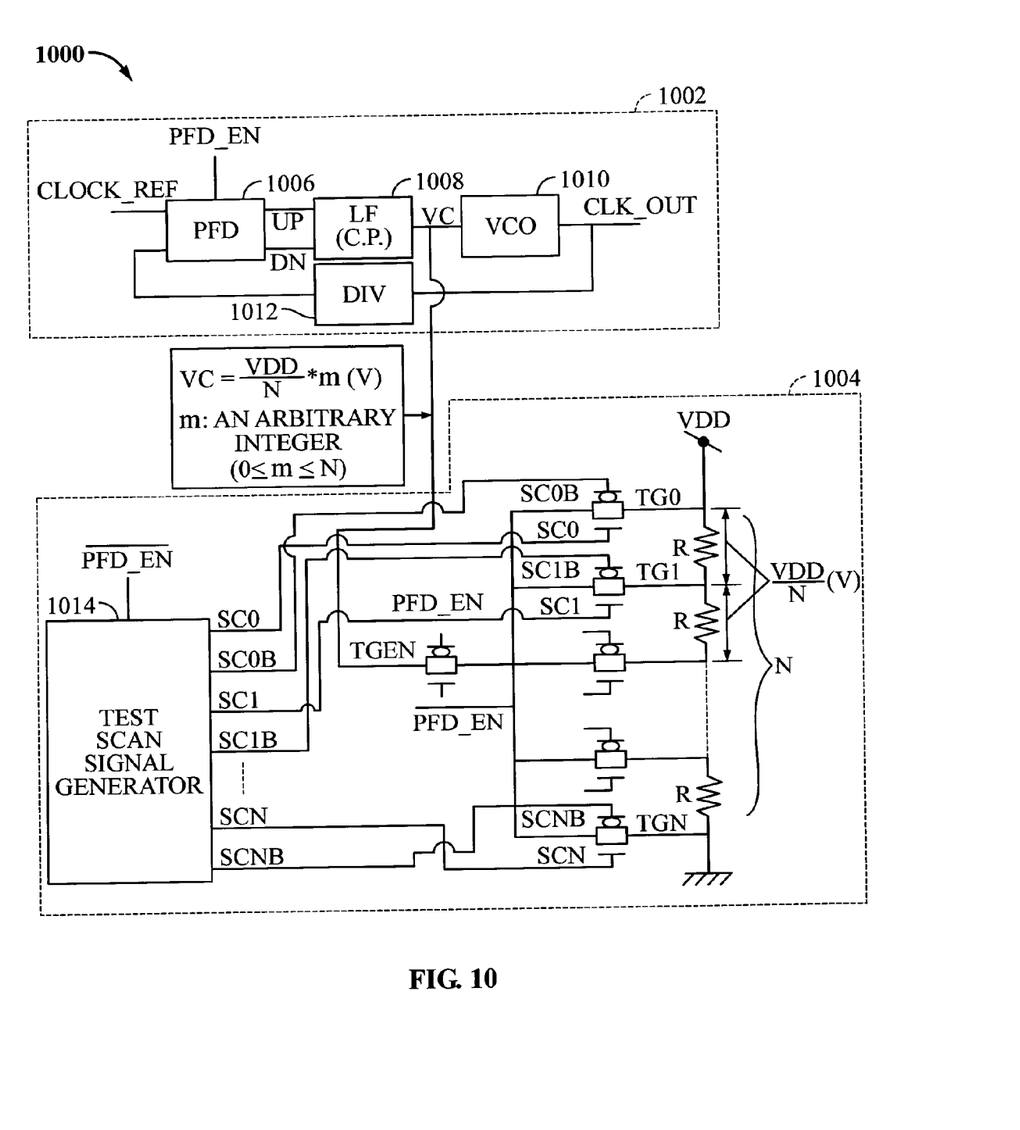
FIG. 10 is a schematic diagram illustrating a PLL along with a test apparatus to further characterize a VCO.

Now referring to FIG. 10, a schematic diagram 1000 illustrates a PLL along with a test apparatus to further characterize a VCO. The schematic diagram 1000 largely includes a PLL 1002 and a test apparatus 1004 coupled to the PLL 1002. The PLL 1002 generally includes a PFD 1006, a CP and LF 1008, a VCO 1010, and a frequency divider 1012. The configuration of various elements of the PLL 1002 is well known in the art, and may be modified without departing from the true spirit of the present invention. Preferably, the test apparatus 1004 includes N resistors coupled in series between supply voltage $V_{DD}$ and ground, N+1 transmission gates TG0 through TGN, and a test scan signal generator 1014, where N is an integer greater than or equal to 1. Note that all transmission gates function basically as low-impedance switches and thus may be replaced with other devices with similar switch functionality.

The N resistors form N+1 nodes between $V_{DD}$ and ground, and each transmission gate is coupled between an input voltage $V_C$ of the VCO and one of the N+1 nodes. The test scan signal generator 1014 is coupled to each of the N+1 transmission gates for controlling the N+1 transmission gates TG0 through TGN. There is additional optional transmission gate TGEN coupled between the input voltage $V_C$ of the VCO 1010 and the N+1 transmission gates TG0 through TGN. This optional transmission gate TGEN functions as an enable switch for the test apparatus 1004. A PFD_EN signal controls the transmission gate TGEN, the test scan signal generator 1014, and the PFD 1006. Therefore, the transmission gate TGEN is turned on while the PFD 1006 is disabled and the test scan signal generator 1014 is enabled. Similarly, the transmission gate TGEN is turned off while the PFD 1006 is enabled and the test scan signal generator 1014 is disabled. Preferably, the PFD_EN signal is asserted during normal operations of the PLL 1002 and deasserted during test operations of the PLL 1002.

Each transmission gate has a p-channel field-effect transistor (FET) and an n-channel FET. Preferably, these FETs are metal-oxide-silicon FETs (MOSFETs). Each transmission gate receives two scan inputs SC<0:N> and SC<0:N>B. For example, the transmission gate TG0 receives two scan inputs SC0 and SC0B, and the transmission gate TG1 receives two scan inputs SC1 and SC1B, and so on. Specifically, SC<0:N> are applied to n-channel FETs, whereas SC<0:N>B are applied to p-channel FETs. The test scan signal generator 1014 generates the scan signals SC<0:N> and SC<0:N>B.

Specifically, FIG. 10 involves disabling the PFD 1006 and selectively gating various DC voltages directly to the control voltage input $V_C$ to the VCO 1010 and measuring the resulting VCO frequency CLK_Out via the divider 1012 and test clock outputs. The control voltage input $V_C$ is determined by the equation:

$$V_C = \frac{V_{DD}}{N} * m$$

where:

N is an integer greater than or equal to 1; and m is an arbitrary integer between 0 and N including both 0 and N.

This method requires high degrees of isolation since the VCO input voltage $V_C$ is extremely sensitive to noise, but the method could significantly improve the tolerance to which the lock and capture range of the PLL 1002 can be estimated.

When PFD_EN is in a ground (GND) level, both signals UP and DN are fixed in GND. At that time, the test apparatus 1004 selectively transmits various DC voltages directly to $V_C$ signal, which is the control voltage input to the VCO. Then the resulting VCO frequency is measured via the dividers and test clock outputs.

According to this method, only bare minimum of parasitic capacitance and resistance are added to $V_C$ node, and various DC voltages can be applied to $V_C$ by selecting one of the transmission gates TG0 through TGN.

Transmission gates TG0 through TGN are controlled by test scan signals, SC<0:N> and SC<0:N>B, and are disabled by PFD_EN. When PFD_EN is asserted, transmission gates are all disabled.

Figure 11:
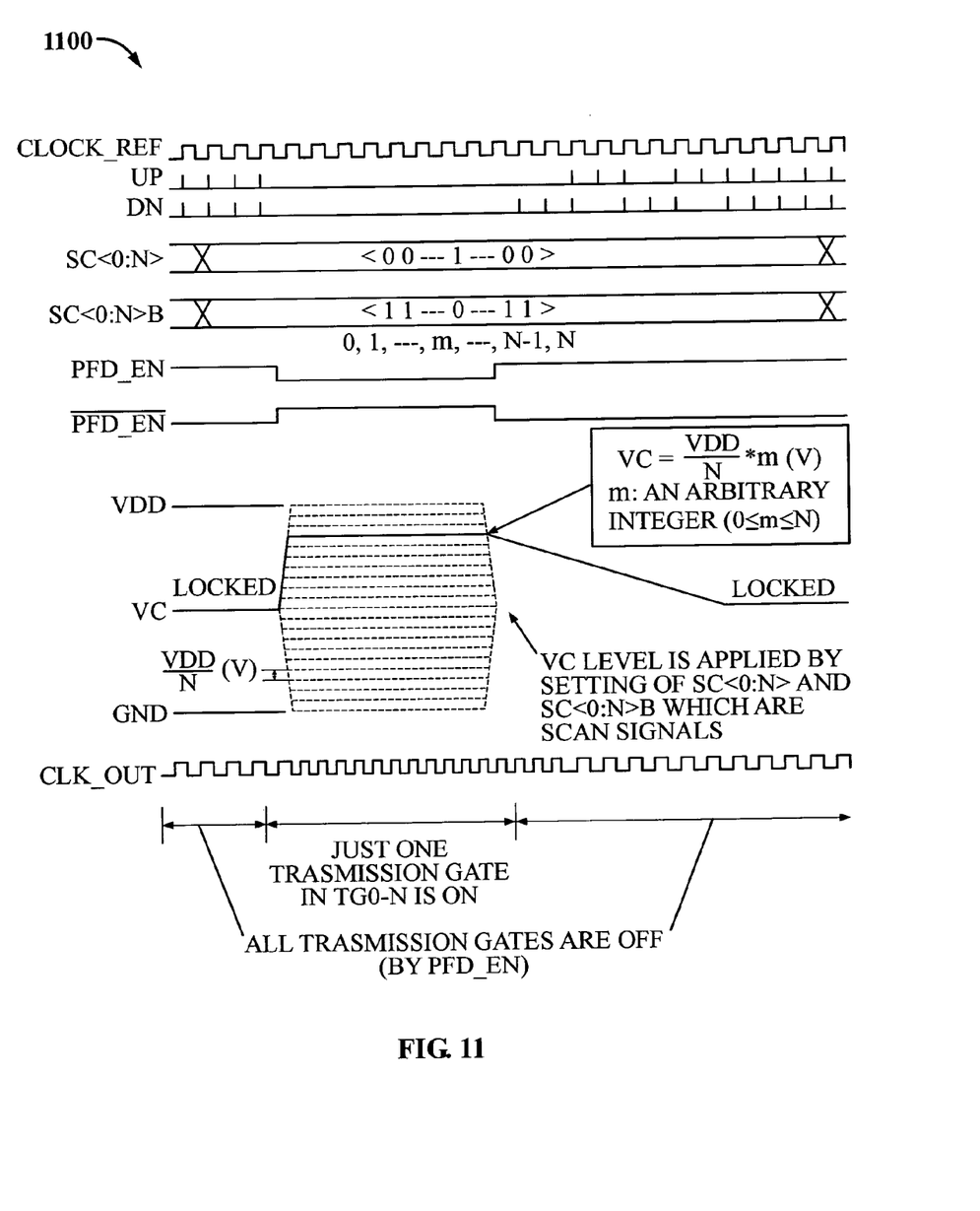
FIG. 11 is a timing diagram illustrating a VCO frequency CLK_Out for a particular VCO input voltage $V_C$ under the bias conditions of FIG. 10.

In FIG. 11, a timing diagram 1100 illustrates a VCO frequency CLK_Out for a particular VCO input voltage $V_C$ under the bias conditions of FIG. 10. When the PFD_EN is asserted, the PLL 1002 operates under a normal bias condition, and the VCO input voltage VC is determined by the normal operation of the PLL 1002. When the PFD_EN is deasserted, the PLL 1002 operates under a test bias condition, and the VCO input voltage $V_C$ is determined and readily adjusted by the test scan signals SC<0:N> and SC<0:N>B.

Preferably, test scan signals SC<0:N> are all GND level except for "m+1"th signal, which is VDD, whereas test scan signals SC<0:N>B are all VDD except for "m+1"th signal, which is GND. When PFD_EN becomes GND, (VDD/N)*m is applied to $V_C$, and then after PFD_EN becomes VDD, $V_C$ goes to a locked level under a normal operation of the PLL 1002. If CLK_Out is measured at PFD_EN=GND, it is the actual VCO characteristic versus $V_C$.

Figure 12:
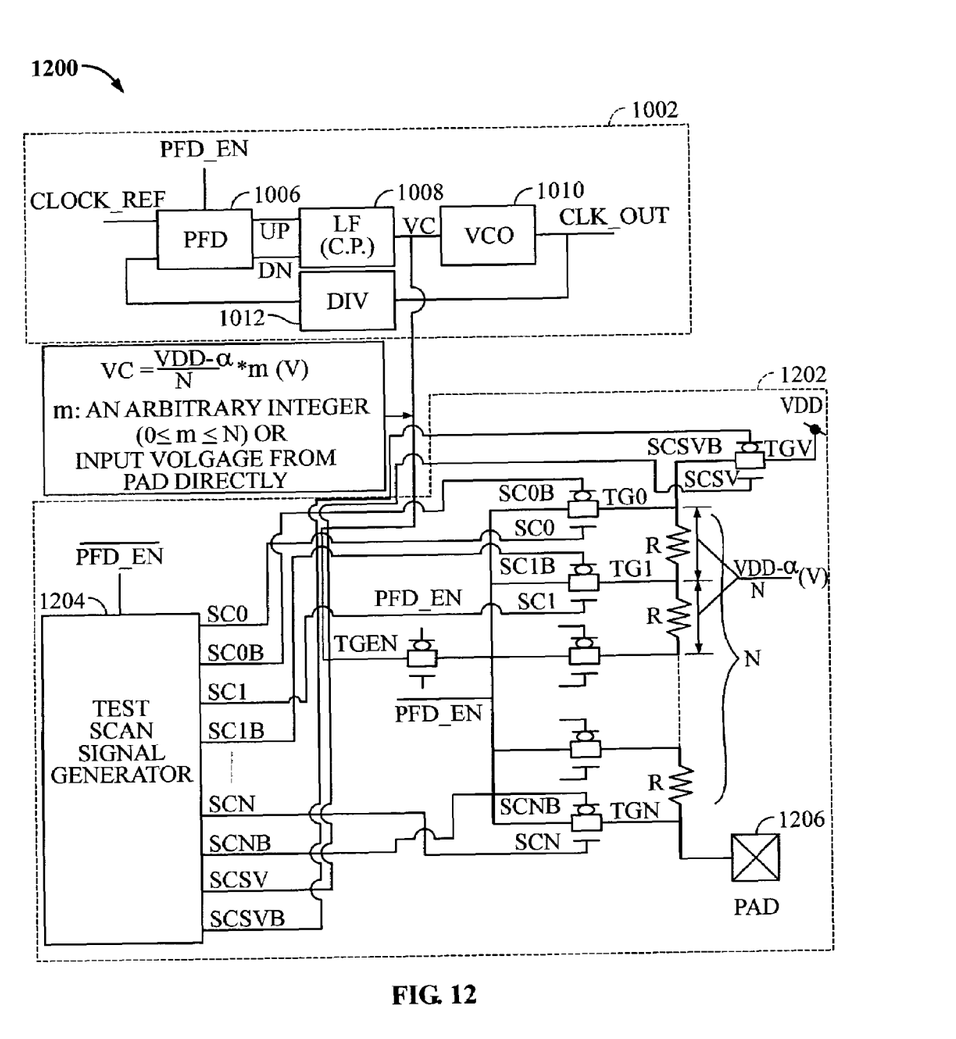
FIG. 12 is a schematic diagram illustrating a PLL along with an alternative test apparatus to further characterize a VCO.

Now referring to FIG. 12, a schematic diagram 1200 illustrates a PLL along with an alternative test apparatus to further characterize a VCO. The PLL 1002 is still used here as shown in FIG. 10. A test apparatus 1202 is now used as an alternative to the test apparatus 1004 of FIG. 10. The test apparatus 1202 is similar to the test apparatus 1004 except a pad 1206, an additional transmission gate TGV, and test scan signals SCSV and SCSVB for TGV.

Figure 13:
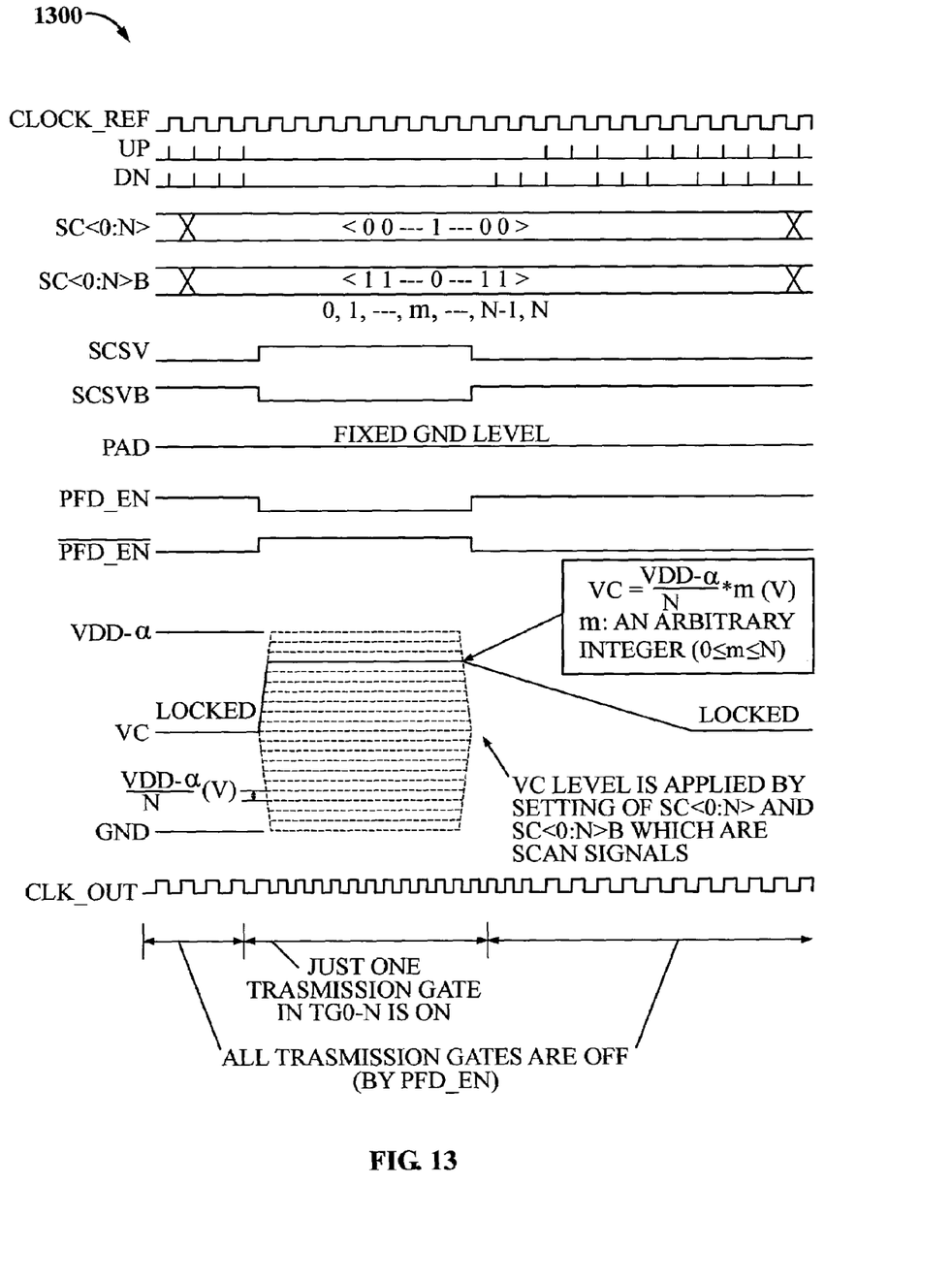
FIG. 13 is a timing diagram illustrating a VCO frequency CLK_Out for a particular VCO input voltage $V_C$ under the bias conditions of FIG. 12.

In FIG. 13, a timing diagram 1300 illustrates a VCO frequency CLK_OUT for a particular VCO input voltage $V_C$ under certain bias conditions of FIG. 12. When the pad 1206 is coupled to GND and the transmission gate TGV is turned on, the schematic diagram 1200 becomes very similar to the schematic diagram 1000, except that a voltage drop across the transmission gate TGV when TGV is turned on may have to be taken into account. Hence, the following equation for the VCO input voltage $V_C$ in a test mode:

$$V_C = \frac{V_{DD} - \alpha}{N} * m$$

where:

N is an integer greater than or equal to 1;

m is an arbitrary integer between 0 and N including both 0 and N; and

α is the voltage drop across the transmission gate TGV.

Figure 14:
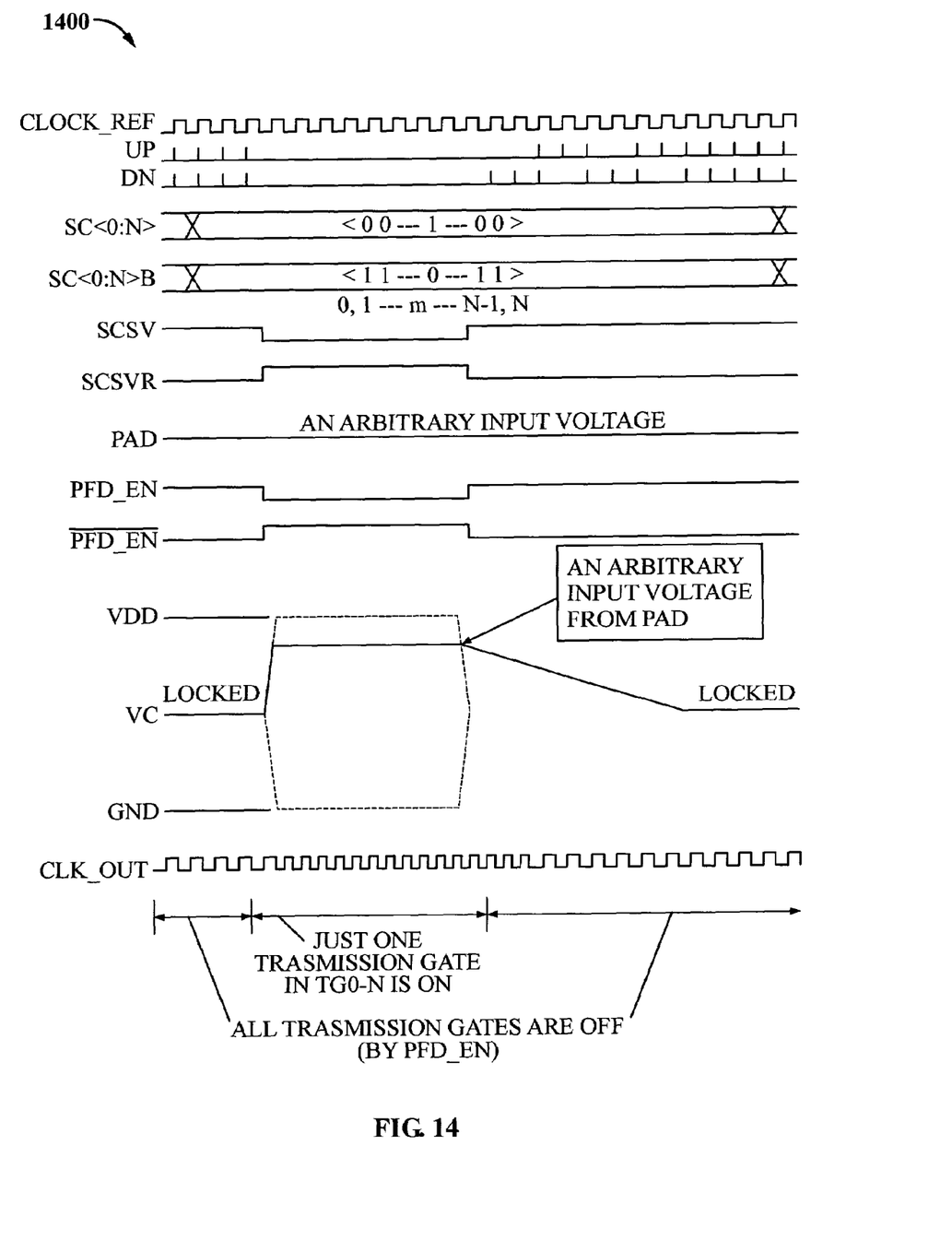
FIG. 14 is a timing diagram illustrating a VCO frequency CLK_Out for a particular VCO input voltage $V_C$ under alternative bias conditions of FIG. 12.

In FIG. 14, a timing diagram 1400 illustrates a VCO frequency CLK_Out for a particular VCO input voltage $V_C$ under alternative bias conditions of FIG. 12. When the transmission gate TGV is turned off and an arbitrary input voltage is applied to the pad 1206, the VCO input voltage, in a test mode, becomes virtually the same as the arbitrary input voltage applied to the pad 1206.

It will be understood from the foregoing description that various modifications and changes may be made in the preferred embodiment of the present invention without departing from its true spirit. This description is intended for purposes of illustration only and should not be construed in a limiting sense. The scope of this invention should be limited only by the language of the following claims.

The invention claimed is:

1. A method for testing a phase-locked loop (PLL) having a phase-frequency detector (PFD), a voltage-controlled oscillator (VCO) receiving input from the PFD, and at least one divider receiving input from the VCO, the method comprising the steps of:

disabling the PFD;

selectively applying a plurality of test input voltages to the VCO;

measuring a minimum and a maximum output frequency of the VCO via the at least one divider as a function of the test input voltages; and determining lock and capture range of the PLL based on the measured minimum and maximum output frequencies of the VCO as a function of the test input voltages.

2. The method of claim 1, further comprising the step of performing a minimal set of tests on the PLL based on the lock and capture range of the PLL.

3. The method of claim 1, wherein the test input voltages are applied to the VCO through at least one transmission gate.

4. An apparatus for testing a phase-locked loop (PLL), the apparatus comprising:

a PLL having a phase-frequency detector (PFD), a voltage-controlled oscillator (VCO) receiving input from the PFD, and at least one divider receiving input from the VCO;

a test input voltage generator coupled to the VCO for selectively applying a plurality of test input voltages to the VCO while the PFD is disabled;

a frequency measuring module for measuring a minimum and a maximum VCO output frequency via the at least one divider and test clock outputs; and means for determining lock and capture range of the PLL based on the measured minimum and maximum VCO output frequencies.

5. The apparatus of claim 4, wherein the test input voltage generator comprises:

N resistors coupled in series between supply voltage and ground, the N resistors forming N+1 nodes between the supply voltage and ground, wherein N is an integer greater than or equal to 1;

N+1 switches, each switch being coupled between an input of the VCO and one of the N+1 nodes; and a test scan signal generator coupled to each of the N+1 switches for controlling the N+1 switches.

6. The apparatus of claim 5, wherein the test input voltage generator further comprises a scan-enable switch coupled between the N+1 switches and the input of the VCO, the switch being turned on when the PFD is disabled.

7. The apparatus of claim 6, wherein the scan-enable switch includes a transmission gate.

8. The apparatus of claim 7, wherein the transmission gate has a p-channel field-effect transistor (PFET) coupled to an n-channel field-effect transistor (NFET).

9. The apparatus of claim 5, wherein the test scan signal generator generates a plurality of test scan signals for controlling the N+1 switches when the PFD is disabled.

10. The apparatus of claim 5, wherein at least one of the N+1 switches includes a transmission gate.

11. The apparatus of claim 10, wherein the transmission gate has a p-channel field-effect transistor (PFET) coupled to an n-channel field-effect transistor (NFET).

12. The apparatus of claim 5, wherein the particular test input voltage is determined as follows:

$$V_C = \frac{V_{DD}}{N} * m$$

wherein:

$V_c$ is equivalent to the particular test input voltage;

$V_{DD}$ is equivalent to the supply voltage; and m is an arbitrary integer between 0 and N including both 0 and N.

13. The apparatus of claim 4, wherein the test input voltage generator comprises:

N resistors coupled in series between the supply voltage and ground or the supply voltage and a lower reference voltage, the N resistors forming N+1 nodes between a supply switch and a pad, the supply switch connecting the N resistors to the supply voltage when turned on, wherein N is an integer greater than or equal to 1;

N+1 switches, each switch being coupled between an input of the VCO and one of the N+1 nodes; and a test scan signal generator coupled to each of the N+1 for controlling the N+1 switches.

14. The apparatus of claim 13, wherein the test input voltage generator further comprises a scan-enable switch coupled between the N+1 and the input of the VCO, the switch being turned on when the PFD is disabled.

15. The apparatus of claim 14, wherein the scan-enable switch includes a transmission gate.

16. The apparatus of claim 15, wherein the transmission gate has a p-channel field-effect transistor (PFET) coupled to an n-channel field-effect transistor (NFET).

17. The apparatus of claim 13, wherein the test scan signal generator generates a plurality of test scan signals for controlling the N+1 when the PFD is disabled.

18. The apparatus of claim 13, wherein at least one of the N+1 includes a transmission gate.

19. The apparatus of claim 18, wherein the transmission gate has a p-channel field-effect transistor (PFET) coupled to an n-channel field-effect transistor (NFET).

20. The apparatus of claim 13, wherein the pad is coupled to ground and the supply switch is turned on, and wherein the particular test input voltage is determined as follows:

$$V_C = \frac{V_{DD} - \alpha}{N} * m$$

wherein:

$V_c$ is equivalent to the particular test input voltage;

$V_{DD}$ is equivalent to the supply voltage;

α is equivalent to a voltage drop across the supply switch when the supply switch is turned on;

m is an arbitrary integer between 0 and N including both 0 and N.

21. The apparatus of claim 13, wherein the pad is coupled to an arbitrary input voltage and the supply switch is turned off, and wherein the particular test input voltage is equivalent to the arbitrary input voltage.

22. An apparatus for testing a phase-locked loop (PLL), the apparatus comprising:

a PLL having a phase-frequency detector (PFD), a voltage-controlled oscillator (VCO) receiving input from the PFD, and at least one divider receiving input from the VCO;

a test input voltage generator coupled to the VCO for selectively applying a plurality of test input voltages to the VCO while the PFD is disabled, wherein the test input voltage generator further comprises:

N resistors coupled in series between supply voltage and ground or supply voltage and a lower reference voltage, the N resistors forming N+1 nodes between a supply switch and a pad, the supply switch connecting the N resistors to the supply voltage when turned on, wherein N is an integer greater than or equal to 1;

N+1 switches, each switch being coupled between an input of the VCO and one of the N+1 nodes; and a test scan signal generator coupled to each of the N+1 switches for controlling the N+1 switches to produce voltages that correspond to the VCO;

a frequency measuring module for measuring a minimum and a maximum VCO output frequency via the at least one divider and test clock outputs; and means for determining lock and capture range of the PLL based on the measured minimum and maximum VCO output frequencies.

* * * * *